United States Patent
Xiang et al.

(10) Patent No.: US 12,532,476 B2
(45) Date of Patent: Jan. 20, 2026

(54) SEMICONDUCTOR DEVICE AND FABRICATION METHOD THEREOF

(71) Applicant: UNITED MICROELECTRONICS CORP., Hsin-Chu (TW)

(72) Inventors: Wang Xiang, Singapore (SG); Chia Ching Hsu, Singapore (SG); Shen-De Wang, Hsinchu County (TW); Yung-Lin Tseng, Changhua County (TW); Weichang Liu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 399 days.

(21) Appl. No.: 17/994,401

(22) Filed: Nov. 28, 2022

(65) Prior Publication Data
US 2024/0155843 A1   May 9, 2024

(30) Foreign Application Priority Data
Nov. 7, 2022 (TW) .................. 111142380

(51) Int. Cl.
*H10B 43/35* (2023.01)
*H10B 41/23* (2023.01)
*H10B 41/35* (2023.01)
*H10B 43/23* (2023.01)

(52) U.S. Cl.
CPC ............. *H10B 43/35* (2023.02); *H10B 41/23* (2023.02); *H10B 41/35* (2023.02); *H10B 43/23* (2023.02)

(58) Field of Classification Search
CPC ........ H10B 43/35; H10B 41/35; H10B 43/23; H10B 41/23
See application file for complete search history.

(56) References Cited

U.S. PATENT DOCUMENTS

| | | | |
|---|---|---|---|
| 9,082,837 B2 | 7/2015 | Perera | |
| 2017/0194335 A1* | 7/2017 | Wu | .............. H10D 64/661 |
| 2019/0252399 A1* | 8/2019 | Wu | .............. H10B 41/44 |
| 2023/0039408 A1* | 2/2023 | Huang | .............. H10D 30/69 |

* cited by examiner

*Primary Examiner* — Richard A Booth
(74) *Attorney, Agent, or Firm* — Winston Hsu

(57) ABSTRACT

A semiconductor device includes a substrate having a flash memory region and a logic device region, a logic transistor disposed in the logic device region, and a flash memory transistor disposed in the flash memory region. The flash memory transistor includes a metal select gate having two opposite sidewalls and two memory gates disposed on the two opposite sidewalls of the metal select gate.

10 Claims, 6 Drawing Sheets

SEMICONDUCTOR DEVICE AND FABRICATION METHOD THEREOF

BACKGROUND OF THE INVENTION

1. Field of the Invention

The invention relates to the field of semiconductor technology, in particular to an embedded flash memory (eFlash) and a manufacturing method thereof.

2. Description of the Prior Art

Many micro-controller units with embedded flash memory (flash MCUs) have been mounted in cars in accordance with the introduction of electronic control systems for automotive. Embedded flash memories (eFlash) are used for control program code storage and temporary data storage to provide more flexibility for program update and more elaborate control. As high data processing speed is required for automotive flash MCUs, eFlash is inevitably integrated with high-speed logic CMOS circuits.

In the fabrication process of eFlash, it is important to balance sufficient performance of logic CMOS transistors and memory cell reliability.

SUMMARY OF THE INVENTION

One object of the present invention is to provide an improved embedded flash memory device and manufacturing method thereof to solve the deficiencies or shortcomings of the prior art.

One aspect of the invention provides a semiconductor device including a substrate having a flash memory region and a logic device region; at least one logic transistor disposed in the logic device region; and at least one flash memory transistor disposed in the flash memory region, wherein the at least one flash memory transistor comprises a metal select gate having two opposite sidewalls and two memory gates disposed on the two opposite sidewalls of the metal select gate, respectively.

According to some embodiments, the at least one logic transistor comprises a metal gate.

According to some embodiments, the metal gate and the metal select gate have the same gate structure.

According to some embodiments, each of the metal gate and the metal select gate comprises a high-k gate dielectric layer and a conductive gate electrode.

According to some embodiments, a top surface of the metal gate is coplanar with a top surface of the metal select gate.

According to some embodiments, the semiconductor device further includes two charge storage structures disposed on the two opposite sidewalls of the metal select gate, respectively.

According to some embodiments, each of the two charge storage structures comprises an oxide-nitride-oxide (ONO) storage structure.

According to some embodiments, the two charge storage structures are in direct contact with the high-k gate dielectric layer.

According to some embodiments, the two memory gates are polysilicon gates.

According to some embodiments, the semiconductor device further includes two source/drain doping regions in the substrate and adjacent to the two memory gates, respectively.

Another aspect of the invention provides a method for forming a semiconductor device. A substrate having a flash memory region and a logic device region is provided. At least one logic transistor is formed in the logic device region. At least one flash memory transistor is formed in the flash memory region. The at least one flash memory transistor comprises a metal select gate having two opposite sidewalls and two memory gates disposed on the two opposite sidewalls of the metal select gate.

According to some embodiments, the at least one logic transistor comprises a metal gate.

According to some embodiments, the metal gate and the metal select gate have the same gate structure.

According to some embodiments, each of the metal gate and the metal select gate comprises a high-k gate dielectric layer and a conductive gate electrode.

According to some embodiments, a top surface of the metal gate is coplanar with a top surface of the metal select gate.

According to some embodiments, the method further includes the step of forming two charge storage structures on the two opposite sidewalls of the metal select gate, respectively.

According to some embodiments, each of the two charge storage structures comprises an oxide-nitride-oxide (ONO) storage structure.

According to some embodiments, the two charge storage structures are in direct contact with the high-k gate dielectric layer.

According to some embodiments, the two memory gates are polysilicon gates.

According to some embodiments, the method further includes the step of forming two source/drain doping regions in the substrate and adjacent to the two memory gates, respectively.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
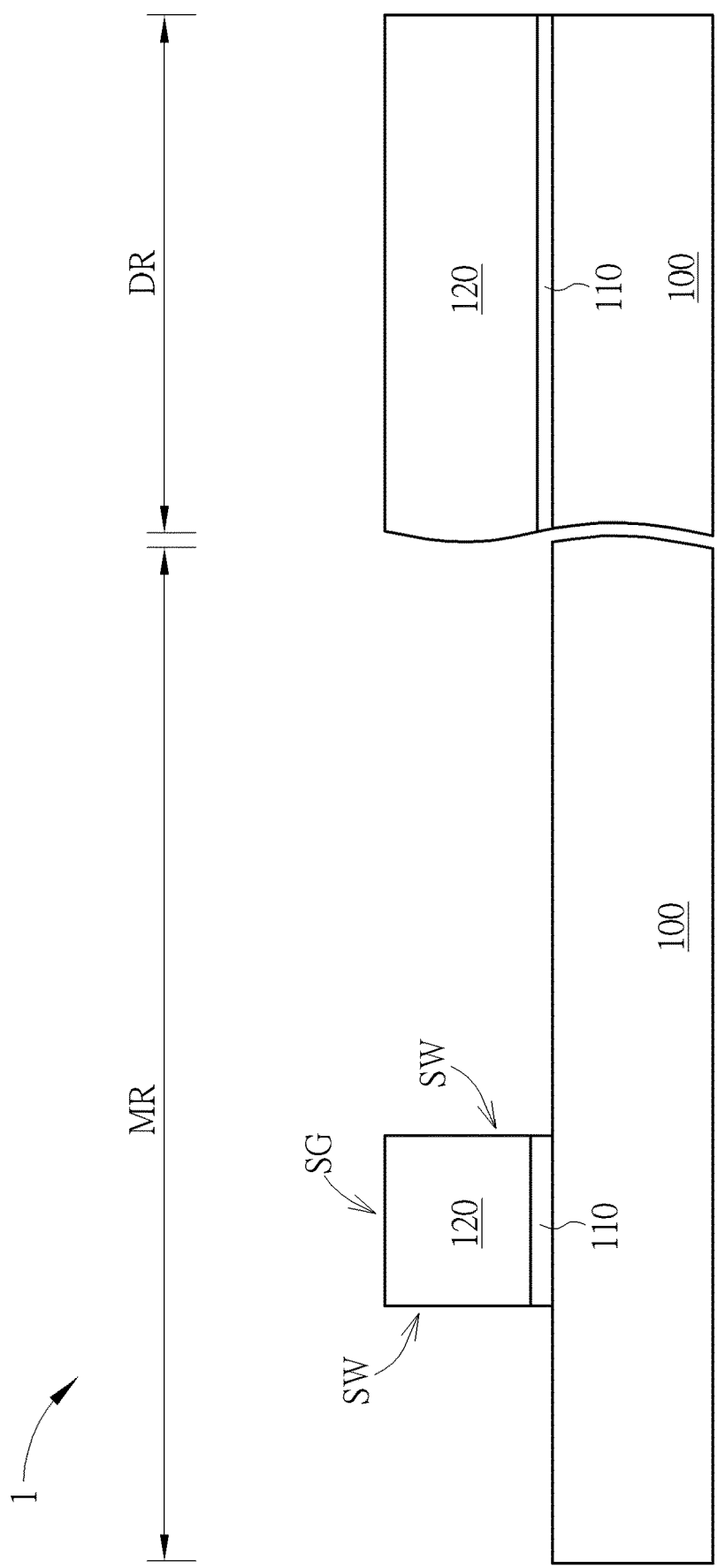
FIG. 1 to FIG. 6 are schematic diagrams of a method for manufacturing a semiconductor device 1 according to an embodiment of the present invention.

Please refer to FIG. 1 to FIG. 6. FIG. 1 to FIG. 6 are schematic diagrams of a method for manufacturing a semiconductor device 1 according to an embodiment of the present invention. As shown in FIG. 1, a substrate 100 such as a silicon substrate is provided. The substrate 100 has a flash memory region MR and a logic device region DR. A gate dielectric layer 110 and a gate material layer 120 are formed on the substrate 100. For example, the gate dielectric layer 110 may include silicon oxide or silicon oxynitride, but is not limited thereto. For example, the gate material layer 120 may include polysilicon, but is not limited thereto. Next, lithography and etching processes are performed to pattern the gate dielectric layer 110 and the gate material layer 120 in the flash memory region MR to form at least one select gate SG. The select gate SG has two opposite sidewalls SW.

Figure 2:
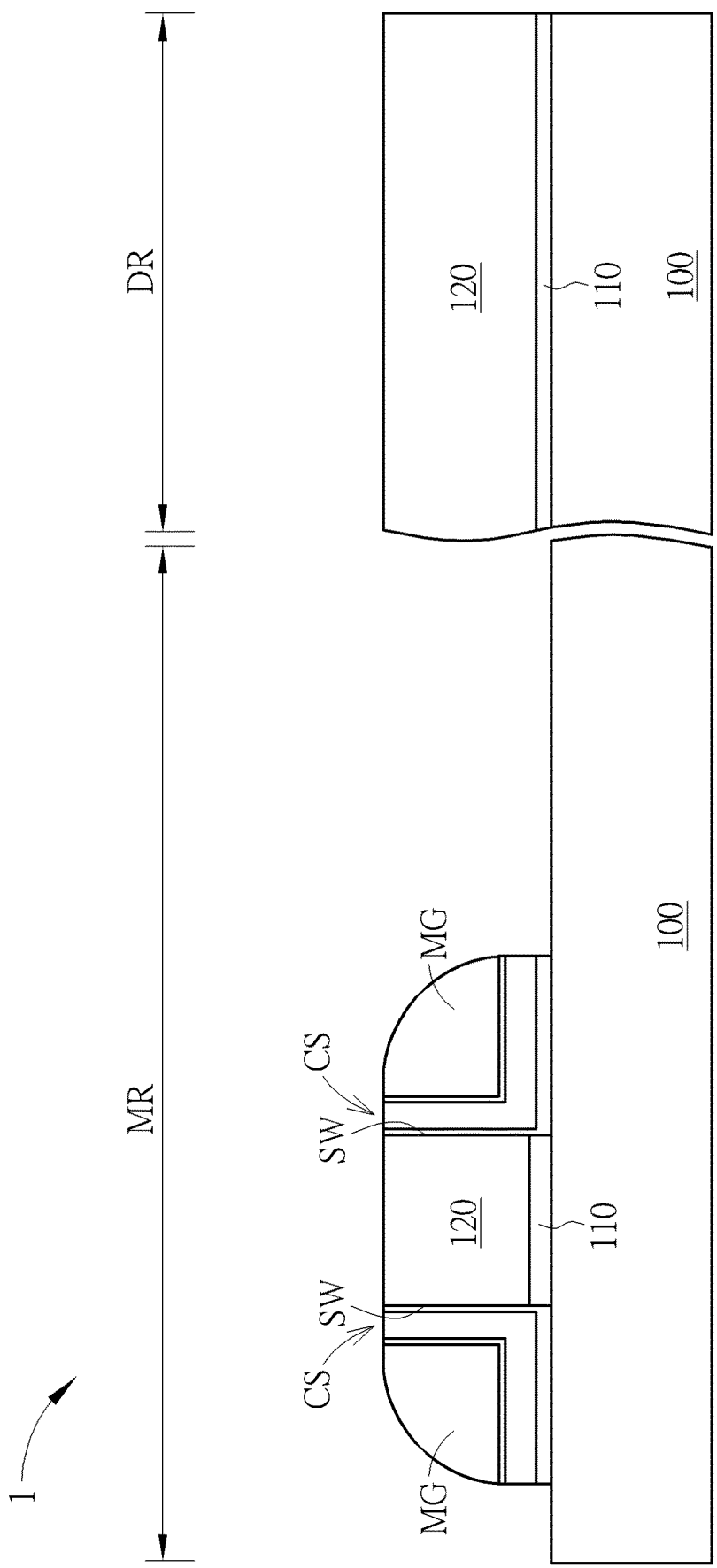

As shown in FIG. 2, left-right symmetrical charge storage structures CS and memory gate MG are formed on two opposite sidewalls SW of the select gate SG in the flash memory region MR. According to an embodiment of the present invention, the charge storage structure CS may include an oxide-nitride-oxide (ONO) storage structure. According to an embodiment of the present invention, the charge storage structure CS extends from two opposite sidewalls SW of the select gate SG to the substrate 100 to form an L-shaped profile. According to an embodiment of the present invention, the memory gate MG may be a polysilicon gate, but is not limited thereto.

Figure 3:
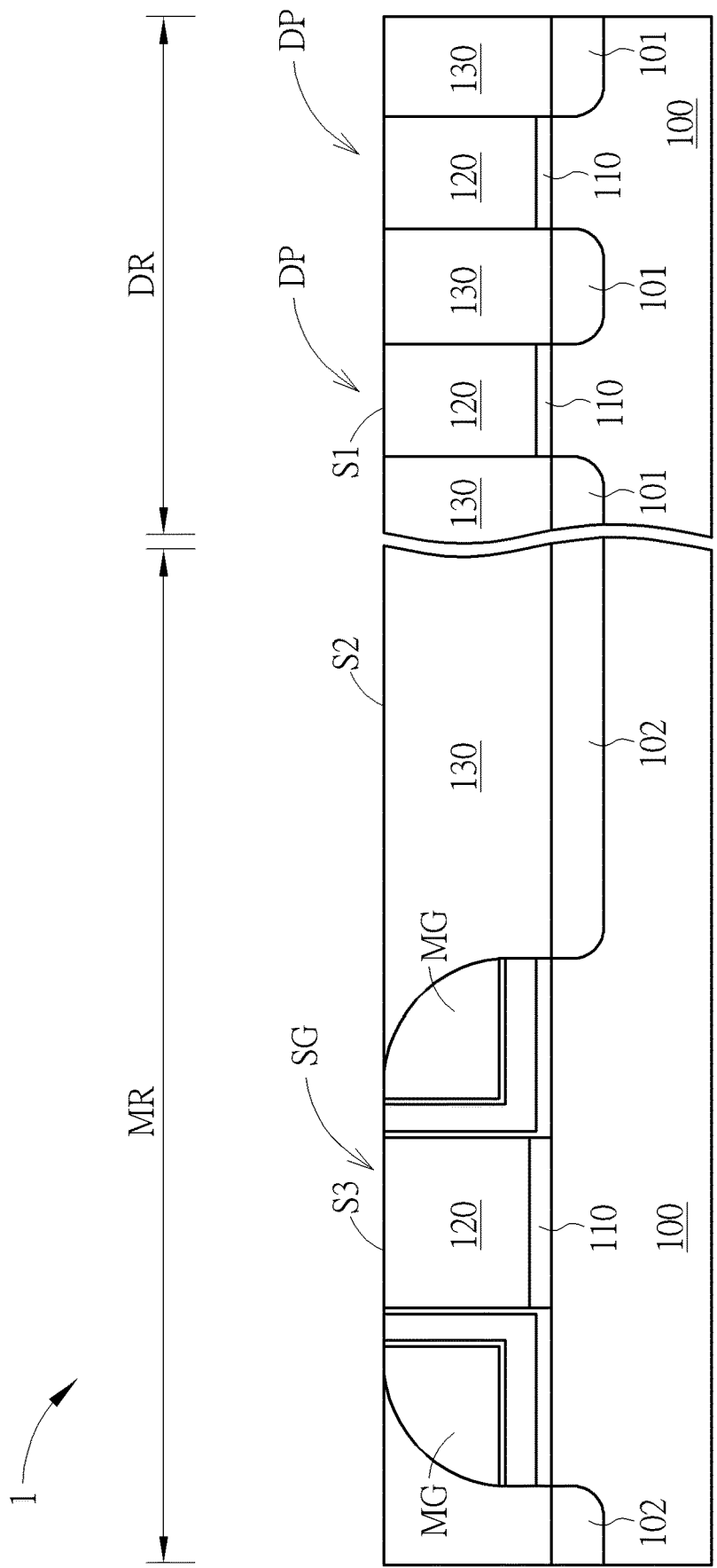

As shown in FIG. 3, lithography and etching processes are then performed to pattern the gate dielectric layer 110 and the gate material layer 120 in the logic device region DR to form at least one dummy gate DP. Subsequently, an ion implantation process is performed to form source/drain doped regions 101 and source/drain doped regions 102 in the substrate 100 in the logic device region DR and the flash memory region MR, respectively. The source/drain doped regions 102 are adjacent to the memory gates MG. A chemical vapor deposition (CVD) process is then performed to deposit a dielectric layer 130 on the substrate 100 in a blanket manner. The dielectric layer 130 may be a silicon oxide layer, but not limited to. A planarization process, such as a chemical mechanical polishing (CMP) process, is then performed to level the top surface S1 of the dummy gate DP, the top surface S3 of the select gate SG and the top surface S2 of the dielectric layer 130.

Figure 4:
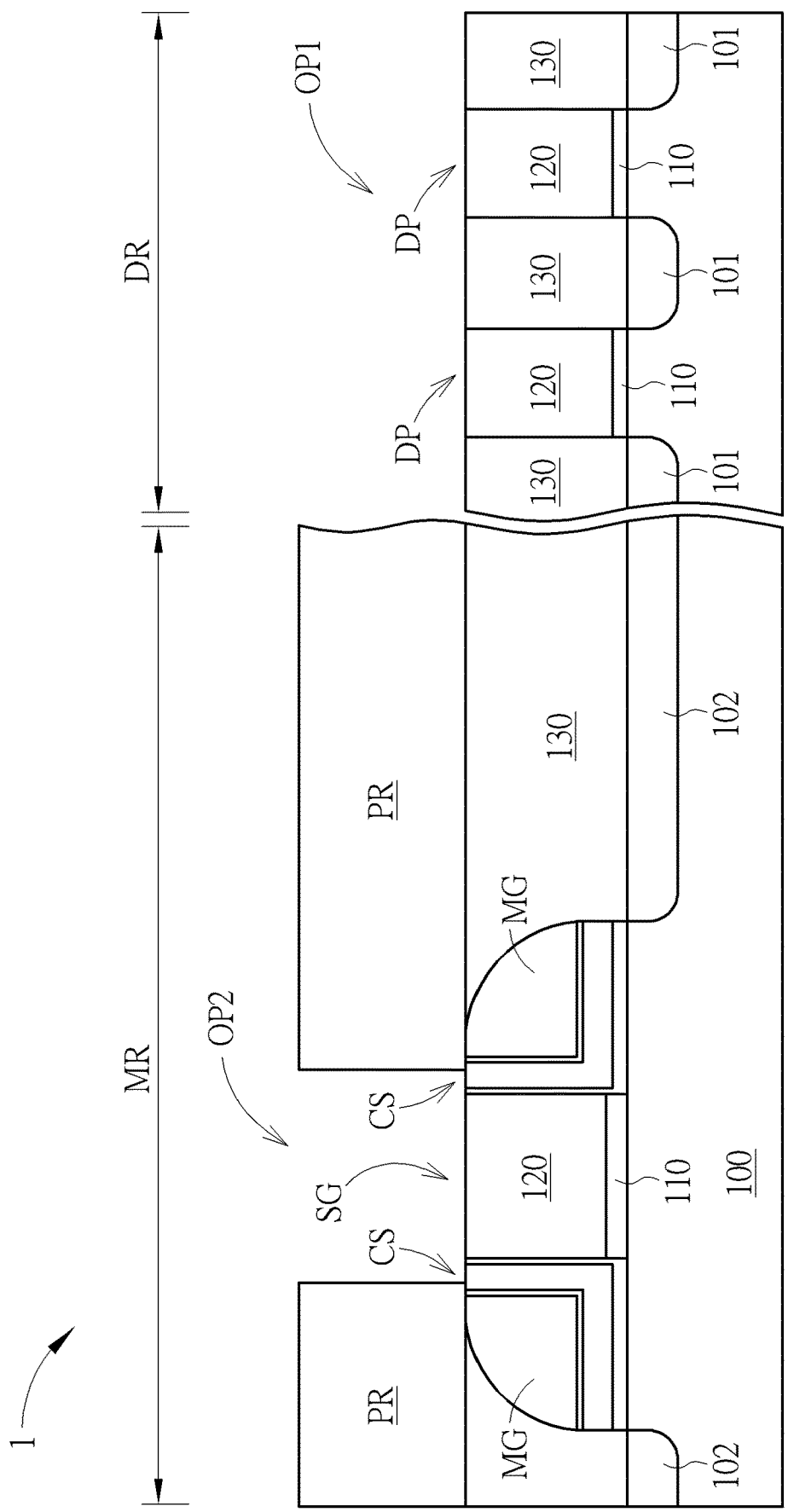

Subsequently, a replacement metal gate (RMG) process is performed. As shown in FIG. 4, a photoresist pattern PR is first formed. The photoresist pattern PR has an opening OP1 and an opening OP2. The opening OP1 reveals the logic device region DR, and the opening OP2 reveals the select gate SG in the flash memory region MR.

Figure 5:
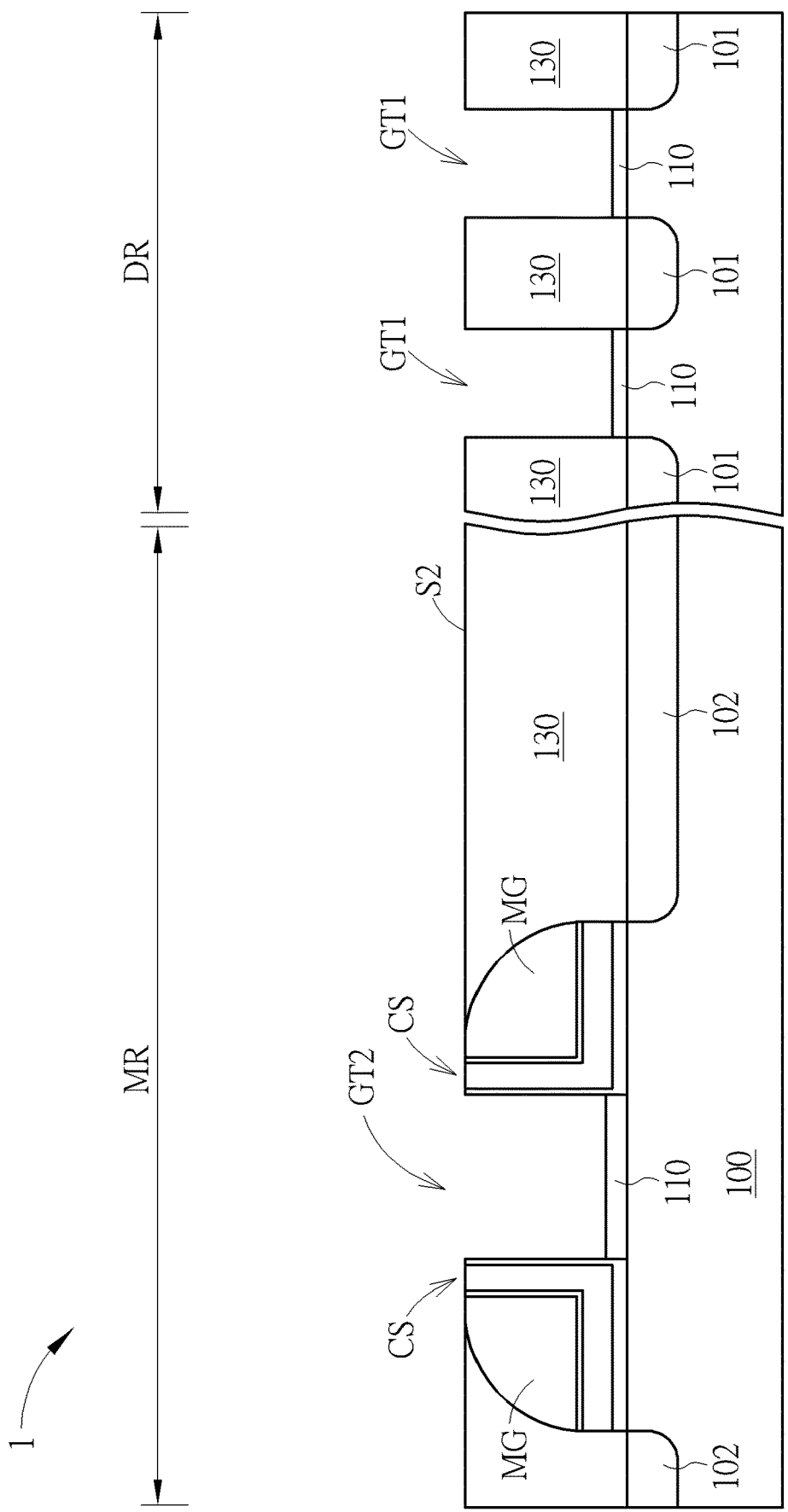

As shown in FIG. 5, an etching process is performed to remove the dummy gate DP in the logic device region DR and the select gate SG in the flash memory region MR, thereby forming a gate trench GT1 and a gate trench GT2, respectively. Subsequently, the photoresist pattern PR is removed.

Figure 6:
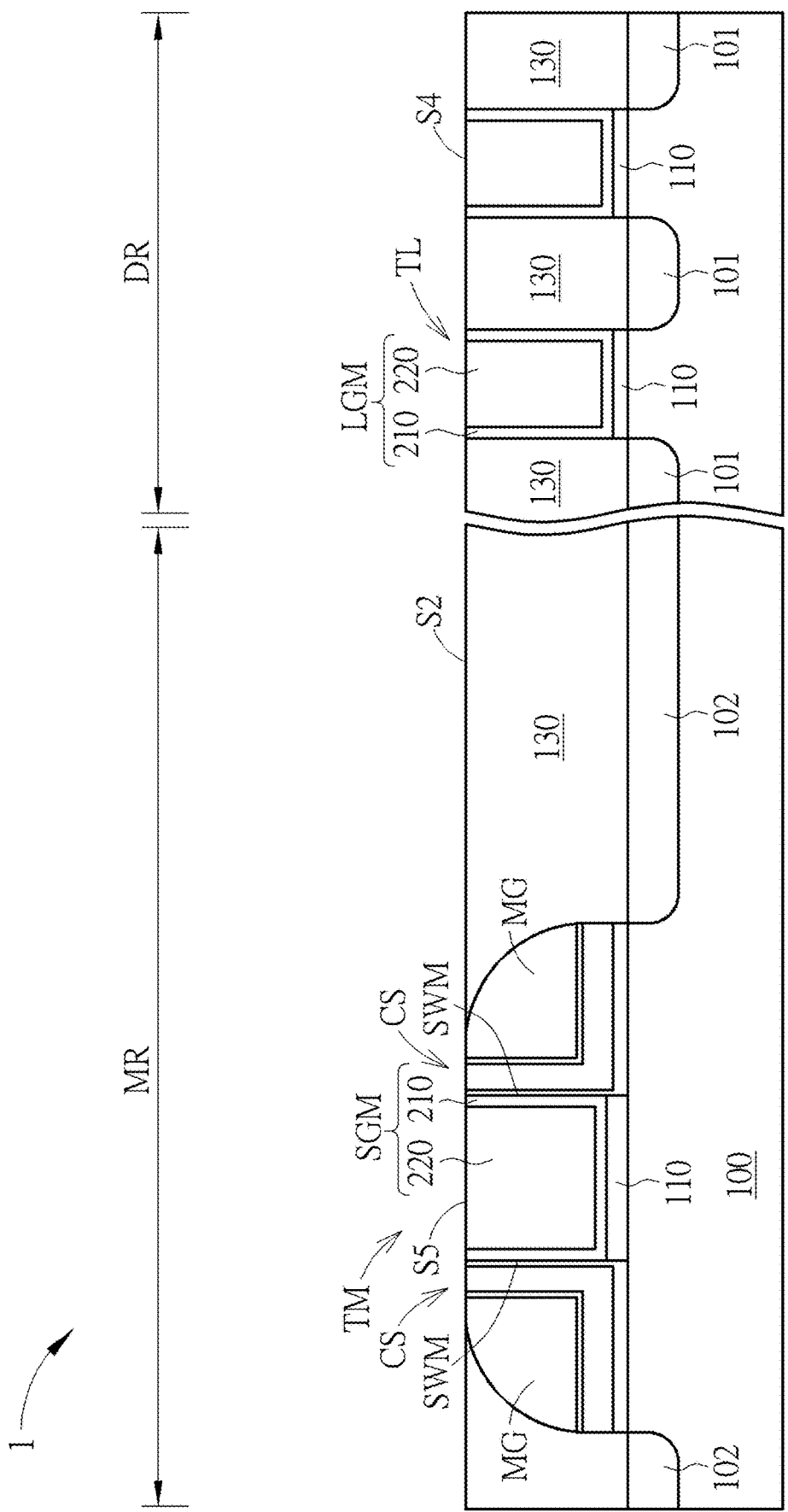

As shown in FIG. 6, a metal gate LGM and a metal select gate SGM are respectively formed in the gate trench GT1 and the gate trench GT2, so that at least one logic transistor TL is formed in the logic device region DR, and at least one flash memory transistor TM is formed in the flash memory region MR. According to an embodiment of the present invention, in the flash memory region MR, the two memory gates MG are disposed on two opposite sidewalls SWM of the metal select gate SGM, respectively.

According to an embodiment of the present invention, the metal gate LGM and the metal select gate SGM have the same gate structure. According to an embodiment of the present invention, both the metal gate LGM and the metal select gate SGM include a high-k gate dielectric layer 210 and a conductive gate electrode 220. According to an embodiment of the present invention, the high-k gate dielectric layer 210 may include hafnium oxide, but is not limited thereto. According to an embodiment of the present invention, the conductive gate electrode 220 may include tungsten, copper, aluminum, titanium, titanium nitride, or any combination thereof.

According to an embodiment of the present invention, the top surface S4 of the metal gate LGM is coplanar with the top surface S5 of the metal select gate SGM. According to an embodiment of the present invention, the two charge storage structures CS are in direct contact with the high-k gate dielectric layer 210, respectively.

Structurally, as shown in FIG. 6, the semiconductor device 1 includes a substrate 100 with a flash memory region MR and a logic device region DR. At least one logic transistor TL is disposed in the logic device region DR, and at least one flash memory transistor TM is disposed in the flash memory region MR. The flash memory transistor TM includes a metal select gate SGM with two opposite sidewalls SWM and two memory gates MG disposed on the two opposite sidewalls SWM of the metal select gate SGM, respectively. According to an embodiment of the present invention, the memory gates MG are polysilicon gates. According to an embodiment of the present invention, the semiconductor device 1 further includes two source/drain doped regions 102 disposed in the substrate 100 and adjacent to the two memory gates MG respectively.

According to an embodiment of the present invention, the logic transistor TL includes a metal gate LGM. The metal gate LGM and the metal select gate SGM have the same gate structure. Both the metal gate LGM and the metal select gate SGM include the high-k gate dielectric layer 210 and the conductive gate electrode 220. The top surface S4 of the metal gate LGM is coplanar with the top surface S5 of the metal select gate SGM.

According to an embodiment of the present invention, two charge storage structures CS are disposed on two opposite sidewalls SWM of the metal select gate SGM, respectively. Each of the charge storage structures CS comprises an oxide-nitride-oxide (ONO) storage structure. The two charge storage structures CS are in direct contact with the high-k gate dielectric layers 210.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate having a flash memory region and a logic device region;
at least one logic transistor disposed in the logic device region; and
at least one flash memory transistor disposed in the flash memory region,
wherein the flash memory transistor comprises a metal select gate having two opposite sidewalls and two memory gates respectively disposed on the two opposite sidewalls of the metal select gate; and two charge storage structures respectively disposed between the two memory gates and the substrate, wherein each of the two charge storage structures has an L-shaped profile,
wherein the metal select gate comprises a high-k gate dielectric layer in direct contact with the two charge storage structures.

2. The semiconductor device according to claim 1, wherein the at least one logic transistor comprises a metal gate.

3. The semiconductor device according to claim 2, wherein the metal gate and the metal select gate have the same gate structure.

4. The semiconductor device according to claim 2, wherein each of the metal gate and the metal select gate comprises a conductive gate electrode.

5. The semiconductor device according to claim 2, wherein a top surface of the metal gate is coplanar with a top surface of the metal select gate.

6. The semiconductor device according to claim 1 further comprising: a dielectric layer on the substrate and covering the metal select gate.

7. The semiconductor device according to claim 1, wherein each of the two charge storage structures comprises an oxide-nitride-oxide (ONO) storage structure.

8. The semiconductor device according to claim 6, wherein each of the two charge storage structures comprises a side surface, and the dielectric layer is in direct contact with the side surface.

9. The semiconductor device according to claim 1, wherein the two memory gates are polysilicon gates.

10. The semiconductor device according to claim 1 further comprising:
two source/drain doping regions in the substrate and adjacent to the two memory gates, respectively.

* * * * *